United States Patent

Thompson et al.

[11] Patent Number: 5,164,594
[45] Date of Patent: Nov. 17, 1992

[54] CHARGED PARTICLE EXTRACTION ARRANGEMENT

[75] Inventors: Stephen P. Thompson, Downham Market; Mark G. Dowsett, Balsall Common, both of England

[73] Assignee: Kratos Analytical, Limited, Urmston, England

[21] Appl. No.: 780,806

[22] Filed: Oct. 22, 1991

[30] Foreign Application Priority Data

Oct. 22, 1990 [GB] United Kingdom ............ 9022897

[51] Int. Cl.⁵ .............................................. H01J 49/04
[52] U.S. Cl. ...................................... 250/288; 250/294; 250/296; 250/309; 250/396 R
[58] Field of Search ............. 250/288, 294, 296, 305, 250/309, 396 R

[56] References Cited

U.S. PATENT DOCUMENTS 4,556,794 12/1985 Ward et al. ............... 250/309
4,800,273 1/1989 Phillips ....................... 250/288

FOREIGN PATENT DOCUMENTS 1242031 8/1971 United Kingdom .
1509697 5/1978 United Kingdom .
2146836A 4/1985 United Kingdom .

Primary Examiner—Jack I. Berman
Attorney, Agent, or Firm—Leydig, Voit & Mayer

[57] ABSTRACT

An arrangement is described for extracting charged particles which have been emitted from a sample due to the impact of a primary ion beam. The arrangement comprises an electrode arrangement effective to produce an electric potential which is non-linear along a chosen direction of travel of the particles. A system of einzel lenses is effective to match the trajectories of the particles passing from the electrode means to the analyser of a mass spectrometer.

18 Claims, 1 Drawing Sheet

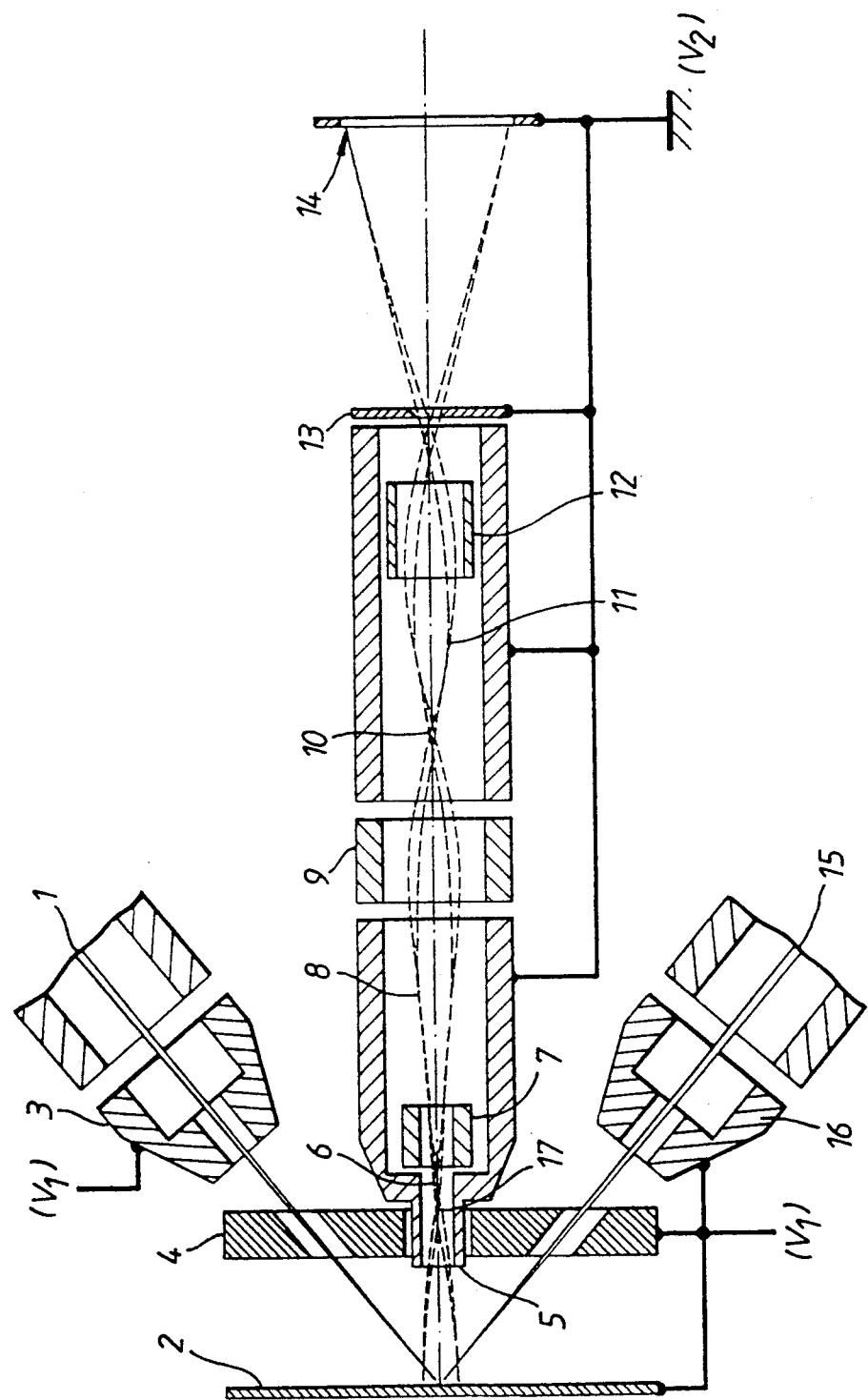

CHARGED PARTICLE EXTRACTION ARRANGEMENT

BACKGROUND OF THE INVENTION

1. Field of the Invention

This invention relates to arrangements for extracting charged particles which have been emitted from a sample. Such an arrangement is used, for example, in a mass spectrometry system for transferring ions from a solid or liquid sample, which has been ablated by means of the impact of a primary beam of ions, fast atoms or neutrals, laser radiation or a microscopic localised discharge, to the analyser of the mass spectrometry system. The ions from the sample, so called secondary ions, may be produced directly in the ablation process, or may be produced by subsequent ionization of the ablated material. For double focussing magnetic sector mass spectrometers (DFMSs) or time of flight mass spectrometers (TOFs) it is necessary for the secondary ions to have energies typically in the range 5 to 10 keV in order to be analysed. Thus the secondary ions are normally strongly accelerated as, or soon after, they leave the sample in order to minimise the effects of their intrinsic energy spread on the spatial and mass resolution of the spectrometer.

2. Description of the Prior Art

Recent developments in material science, particularly in semi-conductor device fabrication, high temperature superconductor fabrication and similar areas, has revealed inadequacies in such arrangements as are currently employed. In the analysis of multi-layer solids it is necessary to achieve a high depth resolution together with a simultaneous high sensitivity. Where the particles are produced by a sputtering process induced by a primary ion or neutral beam, that is the technique known as secondary ion mass spectrometry (SIMS), in order to achieve a high depth resolution it is necessary to reduce the impact energy of the primary beam in the direction normal to the surface of the sample, and to ensure that the eroded region of the sample remains flat. Where the particle extraction arrangement includes means for producing a high electrostatic extraction field which is polarised so as to facilitate the extraction of positively charged secondary ions from the sample, if the primary ion beam is positively charged the beam will be retarded and deflected by the extraction field such that the beam must have a certain impact energy in order to reach the sample. Furthermore, where the primary ion beam is scanned over the sample a high extraction field will cause the impact angle of the primary ions to vary across the sample giving rise to local variations in sputter rate which in turn will cause local variations in the density of the secondary ions emitted from the sample, this leading to non-planar erosion of the sample.

Alternatively, where the primary ion beam comprises negatively charged ions, with known arrangements it is not possible to use impact energies of the primary ion beam on the sample of much less than 10 keV, this leading to a consequent degradation in depth resolution. In the presence of a high extraction field which is polarised to facilitate the extraction of positively charged secondary ions from the sample, such a negatively charged primary beam will also suffer the consequences described above in relation to a positively charged primary beam.

A further problem with known arrangements for the extraction of charged particles is that the detection sensitivity of the mass spectrometer for some components within the sample, may be limited by background signals arising from the return of previously emitted particles from the sample which have coated the electrodes surrounding the sample area, and the adsorption of previously emitted particles contained in the residual gas of the vacuum system. Thus, it is essential to maintain a good vacuum in the region immediately surrounding the sample region. This is made difficult, however, by the need in existing arrangements for extracting particles as used in double focussing magnetic sector mass spectrometer systems, to have electrodes close to the sample in order to provide the necessary electrostatic extraction field. This reduces the efficiency with which the sample region may be pumped, thus increasing the probability that emitted particles may be transferred from the electrodes and residual gas back on to the sample.

A further shortcoming with known arrangements for extracting charged particles occurs with the analysis of topographically patterned or rough samples in arrangements having high electrostatic extraction fields, as departure from sample planarity will cause local perturbations of the extraction field. This will cause ions sputtered from the sample to be emitted on divergent trajectories, with the possibility that the secondary ions do not enter the analyser for the mass spectrometer. Where the spectrometer is operating in a microscope mode, the spectrometer will suffer the disadvantage of a small depth focus, this being a particular problem in the analysis of fully or partly fabricated semi-conductor devices.

Known arrangements for extracting charged particles also suffer further disadvantages when used in the analysis of insulating samples, as charging caused by a charged primary ion beam, together with the ejection of charge in the form of emitted charged particles from the sample, will lead to a progressive change in the sample surface potential until the primary beam is deflected away from the sample. Where the primary ion beam contains positive ions, with the extraction field being polarised so as to facilitate the extraction of positive secondary ions from the sample, charging of the sample may be alleviated by simultaneous bombardment of the sample with a beam of electrons of suitable energy so as to produce a gross charge compensation. In known arrangements for extracting charged particles in which the electrostatic extraction field is high the use of an electron beam in order to perform such charge compensation is ineffective as secondary electrons are readily lost from the sample.

A further disadvantage of known arrangements is that an apparatus such as a mass spectrometer having a finite entrance aperture collects ions most efficiently from a small sample area when, by use of optics providing linear magnification of the secondary ion column ejected from the sample, ions initially ejected from the sample into a large solid angle may be accepted by the spectrometer because of the accompanying angular demagnification. In order to collect ions from the sample efficiently from over a large sample area it is necessary to provide means of optimising the spectrometer to a small static field of view and sweeping this field of view over a desired sample area by means of appropriate optical devices. By the use of beam scanning plates or a so-called double deflection scanning system, fields of view of up to 0.5 mm diameter may be achieved if a high electrostatic extraction field is combined with a small extraction gap. However, when analysing very thin layers or attempting to examine both lateral and depth distributions of a sample simultaneously it is necessary to address a sample area of up to 2 mm sq. This is not possible with present arrangements for extracting charged particles without the use of a sample scanning stage.

A further problem arises in the analysis of liquids and liquid suspensions. In the presence of a high electrostatic extraction field, the surface of the liquid may become disrupted causing serious instabilities in particles emitted from the sample. Furthermore, the necessary closely coupled extraction optics will reduce the pumping capability of the vacuum system in the region surrounding the sample. High gas pressures in the region around the sample will inhibit the transmission of ions from the sample and may give rise to destructive arcs between the electrodes in the apparatus for extracting the particles.

SUMMARY OF THE INVENTION

It is an object of the present invention to provide an apparatus for extracting charged particles which have been emitted from a sample wherein the above problems are at least alleviated.

According to the present invention, there is provided an apparatus for extracting charged particles which have been emitted from a sample comprising: electrode means for producing an electric potential which is non-linear along a chosen direction of travel of the particles, the resultant electric field being substantially confined to the region of the sample, the field being such that the initial potential gradient experienced by the emitted particles is small compared to the final potential gradient due to the non-linearity of the electric field, and a focussing means effective to match the trajectories of the particles passing from the electrode means to the input of a charged particle analyser means.

Where the analyser is a double focussing magnetic spectrometer the focussing means is effective to produce an ion optical pupil at the entrance slit of the spectrometer.

It will be seen that by use of an arrangement in accordance with the invention, primary ions of the same polarity as the ions extracted from the sample may reach the sample by travelling essentially outside the strong region of the electrostatic extraction field. It is thus possible to have primary ions having impact energies of less than 150 eV measured normal to the surface of the sample, whilst maintaining impact angles of less than 60° to the normal to the sample surface. Furthermore, primary ions of the opposite polarity to the particles extracted from the sample may also reach the sample by travelling outside the strong region of the extraction field. It is then also possible to have primary ion impact energies of less than 150 eV normal to the surface of the sample, whilst maintaining impact angles of less than 35° to the normal if the potential of the primary ions floats at the same potential as that of the sample, or one keV greater than the magnitude of the extraction potential if the primary ions do not float at the sample potential.

It will also be seen that a low energy electron beam for charge compensation may be readily incorporated in an arrangement in accordance with the invention.

The electrode means suitably comprises a tubular electrode surrounded by a concentric planar electrode. Where positive ions are to be extracted from a sample, the tubular electrode will be held at a negative potential relative to the sample. Alternatively, where negative ions are to be collected from the sample, the tubular electrode will be held at a positive potential relative to the sample. The tubular electrode will normally be held at the same potential as the input to the analyser, this being conveniently grounded. The planar electrode will normally be maintained at a potential close to that of the sample.

In one particular embodiment, the planar electrode may be switchable to the same potential as the tubular electrode so as to give a uniform extraction field.

For fast extraction of positive ions from the sample, the potential of the tubular electrode may be made negative relative to the planar electrode, the potential of the planar electrode being held negative relative to the sample but at substantially the same potential as the input to the analyser. The input to the analyser is conveniently grounded.

Alternatively, for the fast extraction of negative ions from a sample, the tubular electrode will be held at a negative potential relative to the planar electrode, whilst the planar electrode will be held at a negative potential relative to the sample, but at substantially the same potential as the entrance to the analyser.

The planar electrode suitably contains apertures through which primary radiation may be directed at the sample so as to extract the particles from the sample.

According to a second aspect of the present invention there is provided a method for extracting charged particles which have been emitted from a sample comprising: producing an electric potential which is non-linear along a chosen direction of travel of the particles, the resultant electric field being substantially confined to the region of the sample, the field being such that the initial potential gradient experienced by the emitted particles is small compared to the final potential gradient due to the non-linearity of the electric field, and focussing the particles so as to match the trajectories of the particles passing from the electrode means to the input of a charged particle analyser means.

BRIEF DESCRIPTION OF THE DRAWINGS

One embodiment of an arrangement in accordance with the invention will now be described, by way of example only, with reference to the accompanying drawing which is a schematic diagram of a SIMS apparatus incorporating the embodiment.

DESCRIPTION OF THE PREFERRED EMBODIMENT

Referring to the drawing, the apparatus includes a source 1 of primary ions or neutrals with energies typically in the range of 0.5 to 50 keV. The beam from the source 1 is directed at the surface of a sample 2 through an immersion retarding lens 3.

A planar electrode 4 is arranged adjacent to the sample 2, this planar electrode having an aperture through which the beam from the source 1 may pass in order to impact on the surface of the sample 2. Within a further aperture in the planar electrode 4, there is arranged a coaxial tubular electrode 5, which extends in the direction away from the sample 2 in two portions of greater diameter to the portion of the electrode enclosed by the planar electrode 4. An accelerating asymmetric einzel lens 7 is arranged in the bore of the enlarged diameter portion of the electrode 5 adjacent the reduced diameter portion of the electrode 5. A further accelerating einzel lens 9 is positioned between the segments of the tubular electrode, with a third accelerating einzel lens 12 being positioned in the part of the tubular electrode 5 remote from the sample 2 and adjacent the entrance slit 13 to the analyser (not shown) of the mass spectrometer. A field defining aperture 14 is positioned between the slit 13 and the analyser. An electron gun 15 is also provided, this being positioned so as to enable a beam of low energy electrons to be directed via an immersion retarding lens 16 on to the sample 2 through a further aperture in the planar electrode 4.

In use of the apparatus the surface of the sample 2 is maintained at a positive potential $V_1$ with respect to the entrance slit 13 of the analyser of the spectrometer, which is maintained at a potential $V_2$, this conveniently being earth potential. The immersion retarding lenses 3 and 16 and the planar electrode 4 are also maintained at the positive potential $V_1$ whilst the tubular electrode 5 is maintained at the potential $V_2$.

Thus in use of the apparatus the ion beam from the source 1 is effective to emit atomic and molecular sample fragments from the sample by the process known as sputtering, a fraction of these particles being ionised during the emission process. Positive secondary ions sputtered from the sample 2 by the action of the ion beam from the source 1, are collected by the non-linear electrostatic field generated between the sample surface 2, the planar electrode 4 and the coaxial tubular electrode 5. The potentials applied to the sample and the various lenses are effective to cause a virtual field image of the sample to be formed towards infinity, and a real pupil 6 to be formed within the bore of the tubular electrode 5. The accelerating assymetric einzel lens 7 forms a real image 8 of the sample 2 together with a virtual pupil 17, the virtual pupil 17 being slightly displaced back towards the sample 2. The second accelerating einzel lens 9 forms a real pupil 10 and a real image 11 of the sample 2, the particles in the secondary ion beam then being transported to the entrance slits 13 and field defining aperature 14 by the third accelerating einzel lens 12.

Typically, the tip of the tubular electrode 5 will be 10 mm from the surface of the sample 2. The tip of the tubular electrode will be coplanar with or closer to the sample 2 than the planar electrode 4. This permits the introduction of a retractable high magnification optical microscope with a short focal length objective but a large field of view into the space between the said tubular electrode and the said sample. The large extraction gap enables the pumping of the region over the sample. This reduces background signals due to the adsorption of residual gas. The large extraction gap greatly reduces the probability of previously sputtered material returning from the extraction electrodes to the analysed area, thus reducing backgrounds due to memory effects particularly in comparison with presently available commercial equipment which employs an extraction gap of only 5 mm.

It will be seen that the energy of the secondary ions ejected by the sample 2 will be equal to substantially the pass energy of the spectrometer once the tubular electrode 5 has been entered by the ions, as the tubular electrode 5 is at the same potential as the entrance slit 13 to the analyser of the spectrometer, and there is no electrode present which is maintained at a potential intermediate between $V_1$ and $V_2$ between the sample surface 2 and the tubular electrode 5.

Thus the form of the electrostatic extraction field is such that the primary ion beam from the source 1 suffers no net acceleration or deceleration between the planar electrode 4 and the surface of the sample 2. Furthermore, the trajectory of the beam from the source 1 lies substantially outside the strong parts of the non-linear field produced by the electrode system comprising the planar electrode 4 and the tubular electrode 5.

It will also be seen that if the primary ions from the source 1 are floated at the potential $V_1$ then high currents of low energy primary ions may be transported to the surface of the sample 2 irrespective of the relative polarities of primary ion beam produced by the source 1, and the secondary ion beam ejected from the sample 2. It will be appreciated that this situation is the same for primary ions from the source 1 which have the same polarity as the secondary ions ejected from the sample 2, if the ion source is terminated in an ion optical retarding immersion lens, the last electrode 3 of which is held at potential $V_1$.

It will also be seen that, where the primary ions produced by the source 1 are of opposite polarity to the secondary ions emitted by the sample 2, there will exist a net accelerating potential, and the minimum energy with which the primary ions impact on the surface of the sample 2 will have an energy corresponding to an acceleration through a potential $V_1$ minus $V_2$ plus the threshold energy of the ion source 1. This situation can be ensured by the use of the last lens 3 in the source 1 as an accelerating immersion lens and by maintaining the last electrode in the lens at potential $V_1$.

Where the sample 2 is a wholly or partly insulating sample, and it is therefore necessary to simultaneously irradiate the sample 2 with an electron beam from source 15 in order to achieve charge compensation, it will be seen that the electron source 15 may be readily situated outside the electrostatic extraction field and furthermore, that the trajectory of he electron beam from the source 15 will lie substantially outside the strong parts of the non-linear field produced by the electrode system 4 and 5.

It will also be seen that if the lens 16 is maintained at the potential $V_1$, if $V_1$ is negative with respect to the potential $V_2$ of the spectrometer entrance slit 13 in order to facilitate the extraction of negative ions from the sample 2, the minimum energy with which the electrons from the source 15 impact on the surface 2 will correspond to the energy of electrons which have been accelerated through a potential $V_1$ minus $V_2$ plus the threshhold energy of the source 15. It will be seen that the electric field gradient immediately above the sample 2 may be made very small so that charge compensation by means of primary electron induced secondary electrons is efficient and controllable. Because the electric field gradient within a few microns of the sample may be reduced almost to zero with the extraction field polarized so as to facilitate the collection of negative ions, where a positively charged primary ion beam is produced by the source 1 a small excess of positive charge will create a low-potential well which will lead to the trapping of low energy secondary electrons so as to produce a self-stabilising charge compensation mechanism.

It will also be seen that, by means of the electrode structure 4,5, the first ion optical pupil 6 is real, contrary to the situation in previous extraction arrangements, the first optical pupil occuring in the entrance aperture of the optical system of the charged particle extraction arrangement. For this reason, the optics exhibit a very large field of view and where secondary ions are emitted by the sample 2 at distances greater than 1 mm off axis, these may be matched into the analyser of the spectrometer.

It will also be seen that, by means of the electrode structure 4,5, together with the einzel lenses 7,9,12, the static field of view of the spectrometer may be adjusted from in excess of 300 microns to below 10 microns, with exact matching for large, intermediate and small static fields of view. Similarly, the static field of view of the apparatus may be adjusted continuously from above 300 microns to below 10 microns, with the necessity to accurately focus the pupil on the entrance slit of the analyser to enable accurate placement of the field image in the field aperture relaxed. Thus, the dynamic field of view of the apparatus may be extended to 2 sq.mms.

It will be appreciated that the non-linear field applied to the electrode structure 4,5 may be rapidly switched to a conventional field so as to produce a conventional uniform extraction field. The einzel lenses 7,9,12 are located, and are of sufficient number, to perfectly match ions from such a uniform extraction field into the analyser of the spectrometer whilst preserving the necessary relationship between the pupils 6,10, images 8,11, and the aperture 13 to the analyser.

It will also be appreciated that the non-linear field produced by the electrode structure 4,5 may be adjusted so as to produce a greatly increased potential gradient in the region of the sample 2. In such a case, the planar electrode 4 will be held at a potential $V_1$ which is substantially more negative than the potential $V_2$ of the entrance aperture 13 to the analyser of spectrometer when the electrostatic extraction field is polarised, so as to facilitate the collection of positive ions emitted by the sample 2. Alternatively, the planar electrode 4 will be held at a potential $V_1$ which is substantially more positive than the potential of the entrance aperture $V_2$ of the analyser of the spectrometer when the field is polarised so as to facilitate the collection of negative ions emitted from the sample 2. It will also be appreciated that the potential $V_1$ applied to the planar electrode 4 may be switched to the same potential $V_2$ as that of the tubular electrode 6, so as to produce a uniform extraction field if this is required.

It will be appreciated that whilst the particular embodiment described by way of example relates to an ion extraction arrangement, the invention also relates to an arrangement for extracting electrons from a source.

It will also be appreciated that the non-linear field permits post-ionization by means of a laser to take place in a region over the sample which only contains a small potential gradient.

What we claim is:

1. An apparatus for extracting charged particles which have been emitted from a solid or liquid sample comprising electrode means for producing an electric potential which is non-linear along a chosen direction of travel of the particles, the resultant electric field being substantially confined to the region of the electrode means, the field being such that the initial potential gradient experienced by the emitted particles is small compared to the final potential gradient due to the non-linearity of the electric field, and a focusing means effective to match the trajectories of the particles passing from the electrode means to the input of a charged particle analyser means.

2. An apparatus according to claim 1 in which the analyser is a double-focusing magnetic spectrometer, and the focusing means is effective to produce an ion optical pupil at the entrance slit of the spectrometer.

3. An apparatus according to claim 1 in which the analyser is a mass spectrometer, and the focusing means is effective to produce an ion optical pupil at the entrance of the mass spectrometer.

4. An apparatus according to claim 1 where the electric field along the projection of the axis of symmetry of the extraction electrodes to the sample is small at the sample surface and increases monotonically, without an abrupt change in potential gradient towards the extraction electrode.

5. An apparatus according to claim 1 where the symmetry of the electrode means is cylindrical, planar with a plane of reflection in the axis or any combination of the two between the sample and the entrance of the analyser.

6. An apparatus according to claim 1 where the primary beam consists of charged particles and is transported to the sample surface substantially outside the strong region of the extraction field.

7. An apparatus according to claim 1 including means for transporting a low energy beam of electrons to the sample surface substantially outside the strong region of the resultant electric field so as to facilitate the compensation of surface charging of the sample.

8. An apparatus according to claim including means for performing post ionisation, for example electron impact or laser, in a volume close to the sample containing a substantially small electric field so that the post ionised ions enter the mass spectrometer with a small energy spread.

9. An apparatus according to claim 1 wherein the trajectories of the ions extracted from surface are substantially not affected by the roughness of the sample surface being outside the strong electric field near the electrode means.

10. An apparatus according to claim 1 in which the electrode means comprises a tubular electrode surrounded by a concentric planar electrode.

11. An apparatus according to claim 10, including means for holding the tubular electrode at the same potential as the input to the analyser.

12. An apparatus according to claim 10, including means for maintaining the planar electrode at a potential close to that of the sample.

13. An apparatus according to claim 10, including means for switching the planar electrode to the same potential as the tubular electrode, so as to produce a uniform extraction field.

14. An apparatus according to claim 10, including means for holding the potential of the tubular electrode negative relative to the planar electrode, and means for holding the potential of the planar electrode negative relative to the sample, but at substantially the same potential as the input to the analyser.

15. An apparatus according to claim 10, including means for holding the tubular electrode at a positive potential relative to the planar electrode, and the planar electrode at a positive potential relative to the sample, but at substantially the same potential as the input to the analyser.

16. An apparatus according to claim 10 in which the planar electrode contains apertures through which primary radiation may be directed at the sample so as to extract the particles from the sample.

17. An apparatus according to claim 1 in which the large gap between the sample surface and extraction electrode allows improved pumping to reduce contamination by previous analysed surfaces and residual gases.

18. A method for extracting charged particles which have been emitted from a sample comprising producing an electric potential which is non-linear along a chosen direction of travel of the particles, the resultant electric field being substantially confined to the region of the electrode means which produces the electric potential, the field being such that the initial potential gradient experienced by the emitted particles is small compared to the final potential gradient due to the non-linearity of the electric field, and focusing the particles so as to match the trajectories of the particles passing from the electrode means to the input of charged particle analyser means.

* * * * *